(12) United States Patent
Kim et al.

(10) Patent No.: US 12,376,429 B2
(45) Date of Patent: Jul. 29, 2025

(54) INORGANIC LIGHT EMITTING DIODE, DISPLAY MODULE AND MANUFACTURING METHOD THEREOF

(71) Applicant: SAMSUNG ELECTRONICS CO., LTD., Suwon-si (KR)

(72) Inventors: Myunghee Kim, Suwon-si (KR); Taesoon Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 685 days.

(21) Appl. No.: 17/826,548

(22) Filed: May 27, 2022

(65) Prior Publication Data

US 2023/0006098 A1 Jan. 5, 2023

Related U.S. Application Data

(63) Continuation of application No. PCT/KR2022/004856, filed on Apr. 5, 2022.

(30) Foreign Application Priority Data

Jun. 30, 2021 (KR) .................. 10-2021-0085493
Sep. 27, 2021 (KR) .................. 10-2021-0127275

(51) Int. Cl.
*H10H 20/821* (2025.01)
*H01L 23/00* (2006.01)
(Continued)

(52) U.S. Cl.
CPC .......... *H10H 20/821* (2025.01); *H01L 24/95* (2013.01); *H01L 25/0753* (2013.01);
(Continued)

(58) Field of Classification Search
CPC ..... H01L 24/95; H01L 24/27; H01L 25/0753; H10H 20/857; H10H 20/0364; H10H 20/819; H10H 20/01
See application file for complete search history.

(56) References Cited

U.S. PATENT DOCUMENTS 9,196,653 B2 11/2015 Leatherdale et al.
9,281,451 B2 3/2016 Yeh et al.
(Continued)

FOREIGN PATENT DOCUMENTS

CN 109950182 A 6/2019
JP 4802556 B2 10/2011
(Continued)

OTHER PUBLICATIONS

Communication issued Jul. 31, 2024 by the European Patent Office in European Patent Application No. 22833366.2.
(Continued)

*Primary Examiner* — Mohsen Ahmadi
(74) *Attorney, Agent, or Firm* — Sughrue Mion, PLLC

(57) ABSTRACT

An inorganic light emitting diode is disclosed. The inorganic light emitting diode includes a first semiconductor layer, a second semiconductor layer having a light emitting surface composed of four sides, an active layer disposed between the first semiconductor layer and the second semiconductor layer, a first electrode coupled to the first semiconductor layer, and a second electrode coupled to the second semiconductor layer, wherein the light emitting surface has a trapezoid shape in which two opposing sides are symmetric with respect to each other.

14 Claims, 16 Drawing Sheets

(51) Int. Cl.
*H01L 25/075* (2006.01)
*H01L 25/16* (2023.01)
*H10H 20/857* (2025.01)
*H10H 20/825* (2025.01)

(52) U.S. Cl.
CPC ........... *H10H 20/857* (2025.01); *H01L 24/05* (2013.01); *H01L 24/08* (2013.01); *H01L 24/80* (2013.01); *H01L 25/167* (2013.01); *H01L 2224/05553* (2013.01); *H01L 2224/05571* (2013.01); *H01L 2224/05573* (2013.01); *H01L 2224/05639* (2013.01); *H01L 2224/05644* (2013.01); *H01L 2224/08147* (2013.01); *H01L 2224/80136* (2013.01); *H01L 2224/80203* (2013.01); *H01L 2224/80805* (2013.01); *H01L 2224/95101* (2013.01); *H01L 2224/95136* (2013.01); *H01L 2924/12041* (2013.01); *H10H 20/8252* (2025.01)

(56) References Cited

U.S. PATENT DOCUMENTS

| | | | |
|---|---|---|---|
| 10,615,311 | B2 | 4/2020 | Park et al. |
| 11,257,728 | B2 | 2/2022 | Bellman et al. |
| 11,302,562 | B2 | 4/2022 | Wang |
| 11,552,058 | B2 | 1/2023 | Fan |
| 2012/0119237 | A1 | 5/2012 | Leatherdale et al. |
| 2012/0168803 | A1* | 7/2012 | Lee ............... H10H 20/832 257/98 |
| 2016/0343914 | A1* | 11/2016 | Jeon ............... H10H 20/814 |
| 2018/0287028 | A1* | 10/2018 | Chae ............... H10H 20/857 |
| 2019/0019920 | A1* | 1/2019 | Chang ............. H10H 20/8242 |
| 2019/0148601 | A1 | 5/2019 | Park et al. |
| 2019/0326265 | A1* | 10/2019 | Ting ............... H10H 20/856 |
| 2020/0194323 | A1 | 6/2020 | Bellman et al. |
| 2020/0373282 | A1 | 11/2020 | Liu et al. |
| 2021/0184070 | A1 | 6/2021 | Hwang et al. |
| 2021/0233795 | A1 | 7/2021 | Wang |
| 2021/0399160 | A1 | 12/2021 | Cho et al. |
| 2022/0216187 | A1 | 7/2022 | Fan |
| 2022/0262981 | A1* | 8/2022 | Shakoor ............. H10H 20/833 |
| 2023/0253763 | A1* | 8/2023 | Yoo ................. H01S 5/4093 372/38.05 |
| 2023/0273434 | A1* | 8/2023 | Vinish .............. H10H 29/142 359/359 |

FOREIGN PATENT DOCUMENTS

| | | |
|---|---|---|
| JP | 5150361 B2 | 2/2013 |
| KR | 10-2012-0038539 A | 4/2012 |
| KR | 10-2013-0021917 A | 3/2013 |
| KR | 10-2017-0124048 A | 11/2017 |
| KR | 10-2017-0129555 A | 11/2017 |
| KR | 10-2019-0070588 A | 6/2019 |
| KR | 10-2020-0004442 A | 1/2020 |
| KR | 10-2021-0075729 A | 6/2021 |
| WO | 95/17005 A1 | 6/1995 |
| WO | 2020-091252 A1 | 7/2020 |
| WO | 2020/199771 A1 | 10/2020 |
| WO | 2021/056840 A1 | 4/2021 |

OTHER PUBLICATIONS

Search Report and Written Opinion issued Jul. 21, 2022 by the ISA for International Application No. PCT/KR2022/004856.

* cited by examiner

INORGANIC LIGHT EMITTING DIODE, DISPLAY MODULE AND MANUFACTURING METHOD THEREOF

CROSS-REFERENCE TO RELATED APPLICATIONS

This application is a bypass continuation of International Application No. PCT/KR2022/004856, filed on Apr. 5, 2022, which is based on and claims priority to Korean Patent Application No. 10-2021-0085493, filed on Jun. 30, 2021, in the Korean Intellectual Property Office and Korean Patent Application No. 10-2021-0127275, filed on Sep. 27, 2021, in the Korean Intellectual Property Office, the disclosures of which are incorporated by reference herein in their entireties.

BACKGROUND

The disclosure relates to an inorganic light emitting diode, a display module, and a manufacturing method thereof.

A self-luminescence display element displays an image without a color filter and a backlight, and may use an inorganic light emitting diode that emits light by itself.

A display module is operated in units of pixels or subpixels composed of inorganic light emitting diodes and displays various colors. Each pixel or subpixel is controlled by a plurality of thin film transistors (TFTs). A plurality of TFTs are arranged on a flexible substrate, a glass substrate or a plastic substrate. A substrate having a plurality of TFTs mounted thereon, is called a TFT substrate.

Recently, there has been research and development on a display module that transfers an ultra-small light emitting diode (e.g., a micro LED) onto a TFT substrate. A micro LED having a smooth GaN layer surface is required for a fluidic self-assembly transfer technology among various transfer methods, but there is a problem in that efficiency is reduced due to the surface of the micro LED.

SUMMARY

An object of the disclosure is to provide an inorganic light emitting diode, a display module, and a manufacturing method thereof having a structure with high yield and high efficiency.

According to an aspect of the present disclosure, an inorganic light emitting diode may include: a first semiconductor layer; a second semiconductor layer having a light emitting surface; an active layer disposed between the first semiconductor layer and the second semiconductor layer; a first electrode coupled to the first semiconductor layer; and a second electrode coupled to the second semiconductor layer; wherein the light emitting surface has a trapezoid shape, and two opposing sides of the light emitting surface are symmetric with respect to each other.

The light emitting surface may include: a first side and a second side that are disposed parallel to each other; a third side that connects one end of the first side and one end of the second side; and a fourth side that connects another end of the first side and another end of the second side and is symmetric with respect to the third side.

The first side and the second side have different lengths from each other.

The third side is disposed at a first angle with respect to the first side, the fourth side is disposed at a second angle with respect to the first side, and the first angle and the second angle are a same acute angle.

A bottom surface of the inorganic light emitting diode is disposed to oppose the light emitting surface, and the first electrode and the second electrode are disposed on the bottom surface. A size of the light emitting surface is larger than a size of the bottom surface.

The inorganic light emitting diode has an inverted trapezoidal shape when viewed from a side of the inorganic light emitting diode.

The inorganic light emitting diode is left and right symmetric when viewed from the side of the inorganic light emitting diode.

A first side surface and a second side surface which face each other, a third side surface and a fourth side surface which face each other are included between the light emitting surface and the bottom surface of the inorganic light emitting diode, wherein the first side, the second side, the third side, and the fourth side are disposed to have an acute angle with respect to the light emitting surface.

According to another aspect of the present disclosure, a display may include: a plurality of inorganic light emitting diodes including a trapezoidal light emitting surface, a first electrode and a second electrode that are disposed on an opposite surface of the light emitting surface; and a substrate including a plurality of mounting grooves on which the plurality of inorganic light emitting diodes are mounted.

The light emitting surface of the inorganic light emitting diode has a trapezoid shape that is left and right symmetric.

Each of the plurality of mounting grooves has a shape corresponding to the light emitting surface of the plurality of inorganic light emitting diodes, and has a size larger than a size of each of the plurality of inorganic light emitting diodes.

The inorganic light emitting diode has an inverted trapezoidal shape when viewed from a side of the inorganic light emitting diode.

According to another aspect of the present disclosure, there is provided a method of manufacturing a display for mounting a plurality of inorganic light emitting diodes on a substrate. The method may include coupling a guide member provided with a plurality of guide holes to a mounting surface of the substrate; after the guide member is coupled to the substrate, loading the substrate into a container containing liquid; introducing the plurality of inorganic light emitting diodes having a trapezoidal light emitting surface into the liquid; aligning the plurality of inorganic light emitting diodes on the substrate through the plurality of guide holes; bonding the plurality of inorganic light emitting diodes to the substrate; and separating the substrate from the guide member.

The coupling the guide member to the mounting surface of the substrate may include: applying an adhesive to the mounting surface of the substrate, and aligning the plurality of guide holes to correspond to each pixel area on the mounting surface of the substrate.

The method may further include: chemically removing the guide member from the mounting surface of the substrate, using a solvent capable of dissolving the guide member.

According to another aspect of the present disclosure, there is provided a display panel including a plurality of pixels, wherein each of the plurality of pixels includes a plurality of subpixels and at least one thin film transistor; each of the plurality of subpixels includes an inorganic light emitting diode; and the inorganic light emitting diode includes a light emitting surface having a trapezoid shape.

The inorganic light emitting diode further includes: a first semiconductor layer; a second semiconductor layer that comprises the light emitting surface; and an active layer disposed between the first semiconductor layer and the second semiconductor layer.

The inorganic light emitting diode may further include: a first electrode coupled to the first semiconductor layer; and a second electrode coupled to the second semiconductor layer.

The light emitting surface of the inorganic light emitting diode may further include: a first side and a second side that are parallel to each other; a third side that connects one end of the first side and one end of the second side; and a fourth side that connects another end of the first side and another end of the second side and is symmetric with respect to the third side.

The first side and the second side have different lengths from each other.

According to the disclosure, it is possible to provide a high-yield display module by providing an inorganic light emitting diode having a left and right symmetric trapezoid and accurately aligning an electrode of the inorganic light emitting diode and a connection pad of a substrate during fluidic self-assembly.

DETAILED DESCRIPTION

Figure 1:
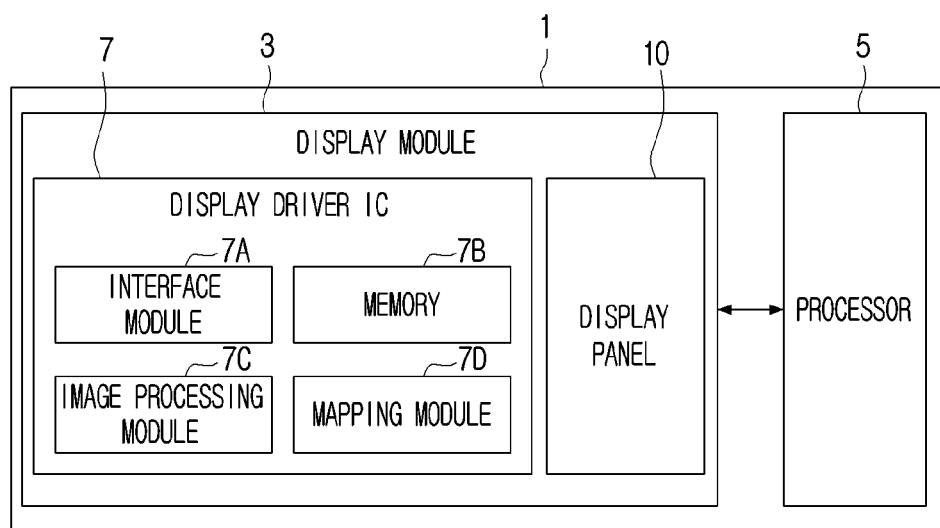
FIG. 1 is a block diagram illustrating a display apparatus according to an embodiment.

Example embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the example embodiments. However, it is apparent that the example embodiments can be practiced without those specifically defined matters. Also, well-known functions or constructions are not described in detail since they would obscure the description with unnecessary detail.

The terms such as "first," "second," and so on may be used to describe a variety of elements, but the elements should not be limited by these terms. The terms used herein are solely intended to explain specific example embodiments, and not to limit the scope of the disclosure.

The terms "include", "comprise", "is configured to," etc., of the description are used to indicate that there are features, numbers, steps, operations, elements, parts or combination thereof, and they should not exclude the possibilities of combination or addition of one or more features, numbers, steps, operations, elements, parts or a combination thereof. When a component is referred to as being "connected" or "coupled" to another element, it may be directly connected or coupled to another element, but it may not be provided between the other element. When a component is referred to as being "connected" or "coupled" to another element, it may not be provided between the other element.

In the disclosure, the term "same" means not only to completely match, but also includes a difference in a degree in consideration of a processing error range.

Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, all of a, b, and c, or any variations of the aforementioned examples.

In describing example embodiments, detailed description of relevant known functions or components may be omitted if it would obscure the description of the subject matter.

In the disclosure, the display module may include a display panel including an inorganic light emitting diode for displaying an image. Here, the display panel may be a plane panel display panel or a curved display panel, and provides better contrast, response time and energy efficiency compared to liquid-crystal displays (LCDs) requiring a backlight since a number of inorganic light emitting diodes (inorganic LEDs) (e.g., micro LEDs or mini LEDs) of 100 μm or less are mounted. In the disclosure, "inorganic light emitting diode" and "inorganic light emitting element" may be used as the same meaning.

The inorganic light emitting diode according to an embodiment of the disclosure has brighter brightness, more luminous efficiency, and longer lifespan than OLED. The inorganic light emitting diode may be a semiconductor chip capable of emitting light by itself when power is supplied. A micro LED, which is an inorganic light emitting diode, has a fast reaction speed, low power, and high luminance. For example, a micro LED is more efficient at converting electricity into photons than an existing LCD or OLED. In other words, it has a higher "brightness per watt" compared to an existing LCD or OLED displays. Accordingly, the micro LED may produce the same brightness with about half energy of an existing LED (each exceeding 100 µm in width, length, and height) or OLED. In addition, a micro LED may realize high resolution, excellent color, contrast, and brightness, and thus it may accurately express a wide range of colors, and implement a clear screen even outdoors in bright sunlight. In addition, the micro LED is strong against burn-in and has low heat generation, and thus a long lifespan is guaranteed without deformation. The micro LED may have a flip chip structure in which an anode and a cathode electrode may be formed on the same first surface and a light emitting surface may be formed on a second surface opposite to the first surface on which the electrodes are formed.

In the disclosure, a TFT layer having a thin film transistor (TFT) circuit is disposed on a front surface of the substrate, and a power supply circuit for supplying power to the TFT circuit, a data driving driver, a gate driving driver, and a timing controller for controlling each driving driver may be disposed on a rear surface of the substrate. A plurality of pixels arranged in the TFT layer may be driven by the TFT circuit.

In the disclosure, the TFT provided in the display module may be a low-temperature polycrystalline silicon (LTPS) TFT, a low-temperature polycrystalline oxide (LTPO) TFT, or an oxide TFT.

In the disclosure, a substrate may use a glass substrate, a synthetic resin-based material having a flexible material (e.g., polyimide (PI), polyethylene terephthalate (PET), polyethersulfone (PES), polyethylene naphthalate (PEN), polycarbonate (PC) etc.) or a ceramic substrate.

In the disclosure, a TFT layer having a TFT circuit formed thereon may be disposed on the front surface of the substrate, and no circuit may be disposed on the rear surface of the substrate. The TFT layer may be integrally formed on the substrate or may be manufactured in the form of a separate film and attached to one surface of the glass substrate.

In the disclosure, the front surface of the substrate may be divided into an active area and an inactive area. The active area may correspond to an area occupied by the TFT layer on the front surface of the substrate, and the inactive area may be an area other than the area occupied by the TFT layer on the front surface of the substrate.

In the disclosure, an edge area of the substrate may be an outermost area of the glass substrate. Also, the edge area of the substrate may be an area remaining except for an area in which circuits of the substrate are formed. Also, the edge area of the substrate may include a portion of the front surface of the substrate adjacent to a side surface of the substrate and a portion of the rear surface of the substrate adjacent to the side surface of the substrate. The substrate may be formed in a quadrangle type. For example, the substrate may be formed in a rectangular shape or a square shape. The edge area of the substrate may include at least one side of four sides of the glass substrate.

In the disclosure, the TFT constituting the TFT layer (or backplane) is not limited to a specific structure or type. For example, the TFT used in the disclosure may be implemented as oxide TFT, Si TFT (poly silicon, a-silicon), organic TFT, graphene TFT, or the like, in addition to a low-temperature polycrystalline silicon TFT (LTPS TFT), and only P-type (or N-type) MOSFET may be made and applied in Si wafer CMOS process.

In the disclosure, the substrate included in the display module is not limited to the TFT substrate. For example, the display module may be a substrate without a TFT layer on which a TFT circuit is formed. In particular, the display module may include a substrate on which a micro IC is separately mounted and only a wiring is patterned.

In the disclosure, a pixel driving method of the display module may be an active matrix (AM) driving method or a passive matrix (PM) driving method. The display module may form a wiring pattern to which each micro LED is electrically connected according to the AM driving method or PM driving method.

In the disclosure, the display module includes a glass substrate on which a plurality of LEDs are mounted and side wiring is formed. Such a display module may be installed and applied in electronic products or electric fields that require a wearable device, a portable device, a handheld device, and various displays as a single unit, and may be applied, though assembly arrangements, to a personal computer (PC) monitor, high-resolution TV and signage (or digital signage), electronic display, or the like, as a matrix type.

The display module of the disclosure may include a plurality of inorganic light emitting diodes for image display arranged on a substrate having a thin film transistor formed on one surface thereof. The plurality of inorganic light emitting diodes may be subpixels constituting a single pixel. In the disclosure, one "light emitting diode", one "micro LED", and one "subpixel" may be used interchangeably as the same meaning.

The example embodiments of the disclosure will be described in greater detail below in a manner that will be understood by one of ordinary skill in the art. However, exemplary embodiments may be realized in a variety of different configurations, and not limited to descriptions provided herein. Also, well-known functions or constructions are not described in detail since they would obscure the invention with unnecessary detail.

Further, example embodiments will be described in detail below with reference to the accompanying drawings and contents described in the accompanying drawings, but the disclosure is not restricted or limited by the example embodiments.

Hereinafter, a display apparatus according to various embodiments of the disclosure will be described with reference to the drawings.

FIG. 1 is a block diagram illustrating a display apparatus according to an embodiment.

Referring to FIG. 1, a display apparatus 1 according to an embodiment of the disclosure may include a display module 3 and a processor 5.

The display module 3 according to an embodiment of the disclosure may display various images. Here, the image is a concept of including a still image and/or a moving image. The display module 3 may display various images such as broadcast content, multimedia content, or the like. Also, the display module 3 may display a user interface and an icon.

The display module 3 may include a display panel 10 and a display driver IC (DDI) 7 for controlling the display panel 10.

A display driver IC 7 may include an interface module 7A, a memory 7B (e.g., a buffer memory), an image processing module 7C, or a mapping module 7D. The display driver IC 7 may receive, for example, image data or image information including an image control signal corresponding to a command for controlling the image data from another element of the display apparatus 1 through the interface module 7A. For example, according to an embodiment, image information may be received from the processor 5 (e.g., a main processor (e.g., an application processor)

or an auxiliary processor (e.g., a graphic processing unit) that operates independently of a function of the main processor.

The display driver IC 7 may communicate with a sensor module through the interface module 7A. Also, the display driver IC 7 may store at least a portion of the received image information in the memory 7B, for example, in units of frames. The image processing module 7C may, for example, pre-process or post-process a portion of the image data based on at least a feature of the image data or a feature of the display panel 10 (e.g., adjusting resolution, brightness, or size). The mapping module 7D may generate a voltage value or a current value corresponding to the image data pre-processed or post-processed by the image processing module 7C. According to an embodiment, the generation of the voltage value or the current value may be performed based on, for example, properties of pixels of the display panel 10 (e.g., arrangement of pixels (RGB stripe or PenTile structure), or a size of each subpixel). At least some pixels of the display panel 10 may be driven based at least in part on the voltage value or the current value, such that visual information (e.g., text, image, or icon) corresponding to the image data may be displayed on the display panel 10.

The display driver IC 7 may transmit a driving signal (e.g., a driver driving signal, a gate driving signal, etc.) to the display based on the image information received from the processor 5.

The display driver IC 7 may display an image based on an image signal received from the processor 5. For example, the display driver IC 7 may generate a driving signal of a plurality of subpixels based on the image signal received from the processor 5, and display an image by controlling light emission of the plurality of subpixels based on the driving signal.

The display module 3 may further include a touch circuit. The touch circuit may include a touch sensor and a touch sensor IC for controlling the touch sensor. The touch sensor IC, for example, may control the touch sensor to detect a touch input or a hovering input with respect to a designated position of the display panel 10. For example, the touch sensor IC may detect the touch input or hovering input by measuring a change in a signal (e.g., voltage, light amount, resistance, or electric charge amount) for the designated position of the display panel 10. The touch sensor IC may provide information (e.g., location, area, pressure, or time) regarding the detected touch input or hovering input to the processor 5. According to an embodiment, at least a part of the touch circuit (e.g., a touch sensor IC) may be included at a part of the display driver IC 7 or the display panel 10, or may be included as a part of another element (e.g., coprocessor) arranged outside of the display module 3.

According to an embodiment, the processor 5 may be implemented as a digital signal processor (DSP), a microprocessor, a graphics processing unit (GPU), an artificial intelligence (AI), a neural processing unit (NPU), a timing controller (T-CON) that processes a digital image signal. However, it is not limited thereto, and may include one or more of a central processing unit (CPU), microcontroller unit (MCU), micro processing unit (MPU), controller, application processor (AP), or communication processor (CP), ARM processor, or may be defined with a corresponding term. In addition, the processor 5 may be implemented as a system on chip (SoC), large-scale integration (LSI), with a built-in processing algorithm, or may be implemented in the form of application specific integrated circuit (ASIC) and field programmable gate array (FPGA).

The processor 5 may, for example, control a number of hardware or software elements connected to the processor 5 by driving an operating system or application program, and perform various data processing and calculations. Also, the processor 5 may load and process a command or data received from at least one of the other components to a volatile memory and store diverse data in a non-volatile memory.

Figure 2:
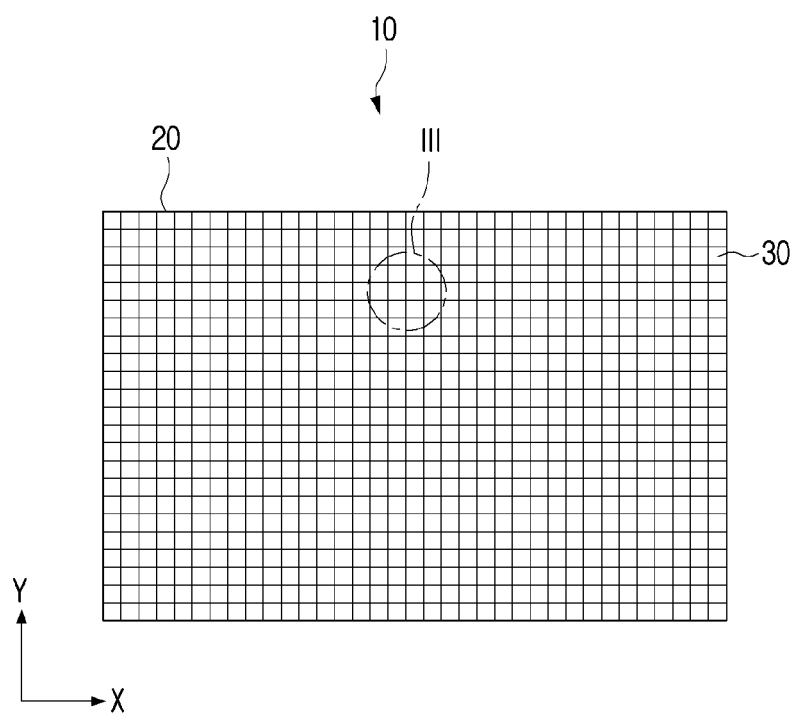
FIG. 2 is a plan view illustrating a display panel included in a display apparatus according to an embodiment.
Figure 3:
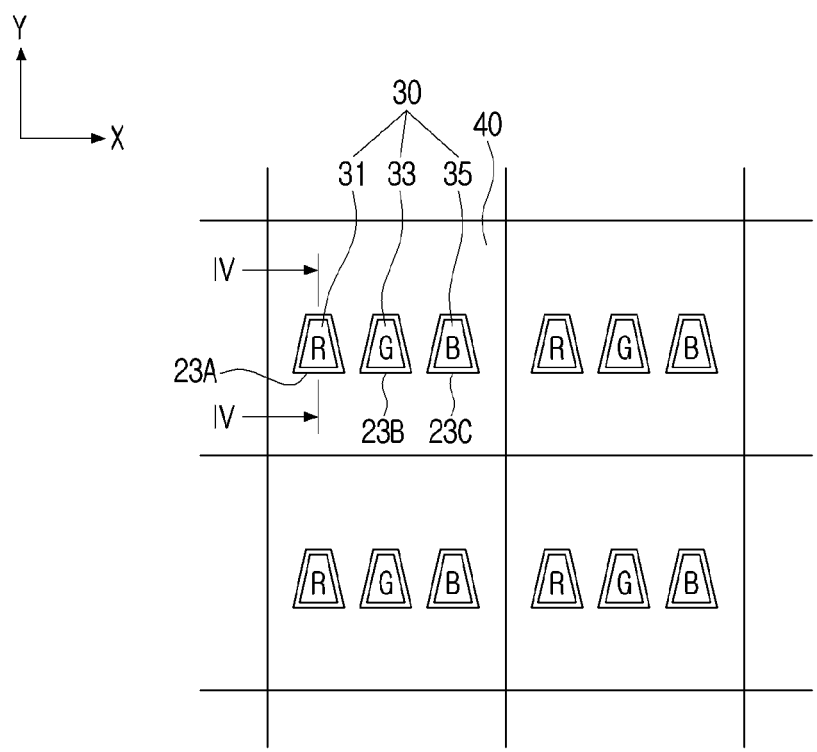
FIG. 3 is an enlarged view of pixels of portion III shown in FIG. 2.

FIG. 2 is a plan view illustrating a display panel included in a display apparatus according to an embodiment, and FIG. 3 is an enlarged view of pixels of portion III shown in FIG. 2.

Referring to FIGS. 2 and 3, the display panel 10 may include a plurality of pixels 30 arranged on a substrate 20. The display panel 10 may include a plurality of pixel areas 40 arranged in a matrix form. One pixel 30 may be disposed in each pixel area 40, and one pixel 30 may be formed with a set of subpixels, for example, including a first subpixel 31 emitting light in a red wavelength band, a second subpixel 33 emitting light in a green wavelength band, and a third subpixel 35 emitting light in a blue wavelength band.

In an area not occupied by the first subpixel 31, the second subpixel 33, and the third subpixel 35 in one pixel area 40, a plurality of thin film transistors (TFTs) may be disposed for driving the first to third subpixels 31, 33, and 35.

The first to third subpixels 31, 33, and 35 may be arranged in a line at regular intervals as shown in FIG. 3, but is not limited thereto. For example, the first to third subpixels 31, 33, and 35 may be arranged in an L-shape or in a PenTile RGBG method. The PenTile RGBG method is a method in which the number of red, green, and blue subpixels is arranged in a ratio of 1:1:2 (RGBG) by using a characteristic that humans distinguish less of blue and best of green. The PenTile RGBG method is effective since it may increase a yield, lower a unit cost, and realize high resolution in a small screen.

According to various embodiments, the display module 3 may be a touch screen combined with a touch sensor, a flexible display, a rollable display, and/or a three-dimensional display (3D display). In addition, according to an embodiment, a large display (e.g., large format display (LFD)) may be implemented by providing a plurality of display modules of the disclosure and physically connecting the modules.

According to various embodiments, the display panel 10 may include a substrate that may be implemented in the form of amorphous silicon (a-Si) TFT, low temperature polycrystalline silicon (LTPS) TFT, low temperature polycrystalline oxide (LTPO) TFT, hybrid oxide and polycrystalline silicon (HOP) TFT, liquid crystalline polymer (LCP) TFT, or an organic TFT (OTFT).

Hereinafter, a structure of the inorganic light emitting diode according to an embodiment of the disclosure will be described.

Figure 4:
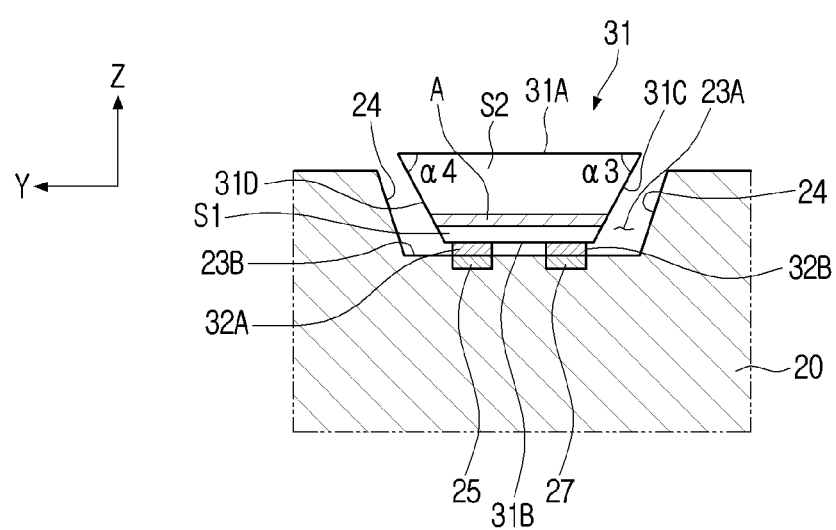
FIG. 4 is a schematic cross-sectional view taken along line IV-IV shown in FIG. 3.
Figure 5:
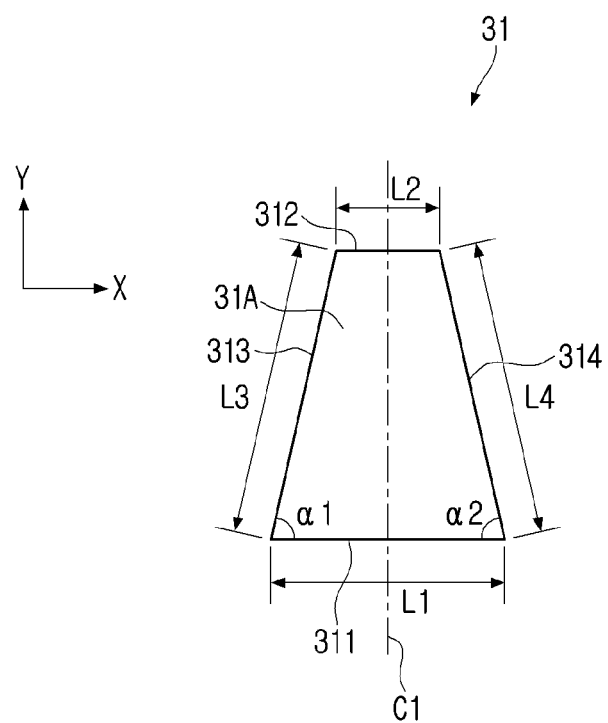
FIG. 5 is a plan view illustrating an inorganic light emitting diode according to an embodiment.
Figure 6:
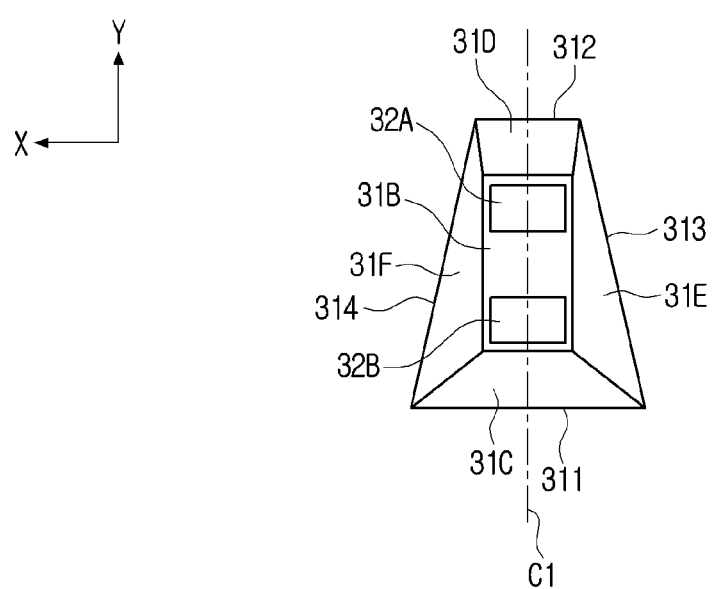
FIG. 6 is a bottom view illustrating an inorganic light emitting diode according to an embodiment.

FIG. 4 is a schematic cross-sectional view taken along line IV-IV shown in FIG. 3, FIG. 5 is a plan view illustrating an inorganic light emitting diode according to an embodiment, and FIG. 6 is a bottom view illustrating an inorganic light emitting diode according to an embodiment. In the disclosure, as the subpixel corresponds to the inorganic light emitting diode, and thus the same reference number 31 is assigned to the inorganic light emitting diode and the subpixel.

In the disclosure, in describing the inorganic light emitting diode, a portion where a light emitting surface 31A of the inorganic light emitting diode 31 may be referred to as an upper side of the inorganic light emitting diode 31, and an opposite side of the light emitting surface 31A of the inorganic light emitting diode 31 may be referred to as a lower side of the inorganic light emitting diode 31 for convenience of description, but is not limited thereto.

Referring to FIG. 4, the inorganic light emitting diode 31 according to an embodiment of the disclosure may be a micro light emitting diode (LED) having a size of about 50 μm or less. The inorganic light emitting diode 31 may be a flip chip type in which both a first electrode 32A and a second electrode 32B are arranged on a bottom surface 31B located on the opposite side of the light emitting surface 31A. However, the present embodiment is not limited thereto, and the inorganic light emitting diode 31 may be a lateral chip type or a vertical chip type.

The inorganic light emitting diode 31 may include a first semiconductor layer Si, a second semiconductor layer S2, grown on an epitaxial substrate (not shown), and an active layer A arranged between the first semiconductor layer S1 and the second semiconductor layer S2.

The first semiconductor layer S1 may include, for example, a p-type semiconductor layer (anode, oxide electrode). The p-type semiconductor layer may include, for example, GaN, AlN, AlGaN, InGaN, InN, InAlGaN, AlInN, or the like, and may be doped with a p-type dopant such as Mg, Zn, Ca, Sr, or Ba.

The second semiconductor layer S2 may include, for example, an n-type semiconductor layer (cathode, reduction electrode). The n-type semiconductor layer may include, for example, GaN, AlN, AlGaN, InGaN, InN, InAlGaN, AlInN, or the like, and may be doped with an n-type dopant such as Si, Ge, or Sn.

Meanwhile, an epitaxially grown portion of the inorganic light emitting diode 31 is not limited to the above-described configuration, and for example, the first semiconductor layer S1 may include the n-type semiconductor layer, and the second semiconductor layer S2 may include the p-type semiconductor layer. The active layer is an area in which electrons and holes recombine, and as the electrons and holes recombine, the active layer transitions to a low energy level and may generate light having a corresponding wavelength.

The active layer A may include a semiconductor material, for example, amorphous silicon or poly crystalline silicon. However, the present embodiment is not limited thereto, and may contain an organic semiconductor material or the like, and may be formed in a single quantum well (SQW) structure or a multi quantum well (MQW) structure.

In the inorganic light emitting diode 31, the first electrode 32A and the second electrode 32B may be disposed on a surface opposite to the light emitting surface 31A. If the first electrode 32A is an anode electrode, the second electrode 32B may be a cathode electrode. The first and second electrodes 32A and 32B may be formed of an alloy containing Ag or Au, but is not limited thereto.

A plurality of mounting grooves 23A, 23B, and 23C into which the plurality of inorganic light emitting diodes 31, 33, and 35 are respectively inserted may be formed on one surface of the substrate 20 as shown in FIG. 3. According to various embodiments of the disclosure, the plurality of inorganic light emitting diodes 31, 33, and 35 may be transferred to the substrate 20 in a fluidic self-assembly method.

Each of the mounting grooves 23A, 23B, and 23C may be formed to be similar to or substantially the same as a shape of the light emitting surface 31A of the inorganic light emitting diode when the substrate 20 is viewed from an upper side of the substrate 20. In particular, as shown in FIG. 3, each of the mounting grooves 23A, 23B, and 23C may be formed to have a size larger than a size of the inorganic light emitting diodes 31, 33, and 35 such that the plurality of inorganic light emitting diodes 31, 33, and 35 are to be inserted into the corresponding mounting grooves 23A, 23B and 23C.

As such, when the shape of each of the mounting grooves 23A, 23B, and 23C is substantially the same as the shape of the inorganic light emitting diodes 31, 33, and 35, as shown in FIG. 4, the first electrode 32A and the second electrode 32B of the inorganic light emitting diode 31 may be guided to be aligned in a mounting groove 23A of the substrate 20 when the fluid self-assembly is performed.

Referring to FIG. 5, the light emitting surface 31A of the inorganic light emitting diode 31 may be substantially plane (e.g., a flat surface). The light emitting surface 31A may have a trapezoid shape, and its shape may be defined by a first side 311, a second side 312, a third side 313, and a fourth side 314.

For example, the first side 311 and the second side 312 facing each other may be disposed substantially parallel to each other with an interval therebetween. A center of the first side 311 and a center of the second side 312 may be respectively located on a first center line C1. A first length L1 of the first side 311 may be shorter than a second length L2 of the second side 312.

A third side 313 may connect one end of the first side 311 and one end of the second side 312, and may be inclined by a first angle α1 from the first side 311. Here, the first angle α1 may be an acute angle. In FIG. 5, a third length L3 of the third side 313 is illustrated to be longer than the second length L2, but it is not limited thereto. For example, the third length L3 may be shorter than or equal to the first length L1. For example, the third length L3 may be shorter than or equal to the second length L2.

The fourth side 314 may connect the other end of the first side 311 and the other end of the second side 312, and may be inclined by a second angle α2 from the first side 311. In particular, the first angle α1 and the second angle α2 may be substantially the same angle. A length L4 of the fourth side 314 may be substantially the same as the length L3 of the third side 314.

Two parallel lines (e.g., the first side 311 and the second side 312) of the light emitting surface 31A may be referred to as bases, and two non-parallel lines (e.g., the third side 313 and the fourth side 314) may be referred to as legs.

As such, the shape of the inorganic light emitting diode 31 may be defined by the first to fourth sides L1, L2, L3, and L4. Referring to FIG. 5, the light emitting surface 31A viewed from the upper side of the inorganic light emitting diode 31 may have a substantially trapezoidal shape. In particular, the light emitting surface 31A may have a trapezoidal shape approximately left and right symmetric with respect to the first center line C1 passing through a center of the inorganic light emitting diode 31.

Referring to FIG. 6, the inorganic light emitting diode 31 may include a first side surface 31C, a second side surface 31D, a third side surface 31E, and a fourth side surface 31F between the light emitting surface 31A and the bottom surface 31B.

When a size of the bottom surface 31B of the inorganic light emitting diode 31 is smaller than a size of the light emitting surface 31A, the first to fourth side surfaces 31C, 31D, 31E, and 31F may be disposed to be inclined.

For example, referring to FIG. 4, the first and second side surfaces 31C and 31D may be disposed to be inclined from an upper side to a lower side of the inorganic light emitting diode 31 as shown in FIG. 4. In particular, an inner wall 24 of the mounting groove 23A may be inclined in a direction substantially similar to the inclination direction of the first and second side surfaces 31C and 31D, respectively. Due to the inclined inner wall 24 of the mounting groove 23A, an upper opening of the mounting groove 23A (for example, entrance of the inorganic light emitting diode 31 to the mounting groove 23a) may be formed wider than a bottom of the mounting groove 23A.

The first side surface 31C of the inorganic light emitting diode 31 may be inclined at a third angle $\alpha 3$ with respect to the light emitting surface 31A, and the second side surface 31D of the inorganic light emitting diode 31 may be included at a fourth angle $\alpha 4$ with respect to the light emitting surface 31A. In particular, both the third angle $\alpha 3$ and the fourth angle $\alpha 4$ are acute angles, and may be substantially the same angle. Accordingly, the side of the inorganic light emitting diode 31 may be an inverted trapezoidal shape (e.g., an inverted isosceles trapezoidal shape) that is left and right symmetric.

Referring to FIG. 6, the bottom surface 31B of the inorganic light emitting diode 31 has a substantially rectangular shape, but is not limited thereto. For example, the bottom surface 31B of the inorganic light emitting diode 31 may have various shapes, such as a square shape, a trapezoidal shape, or the like.

Figure 7:
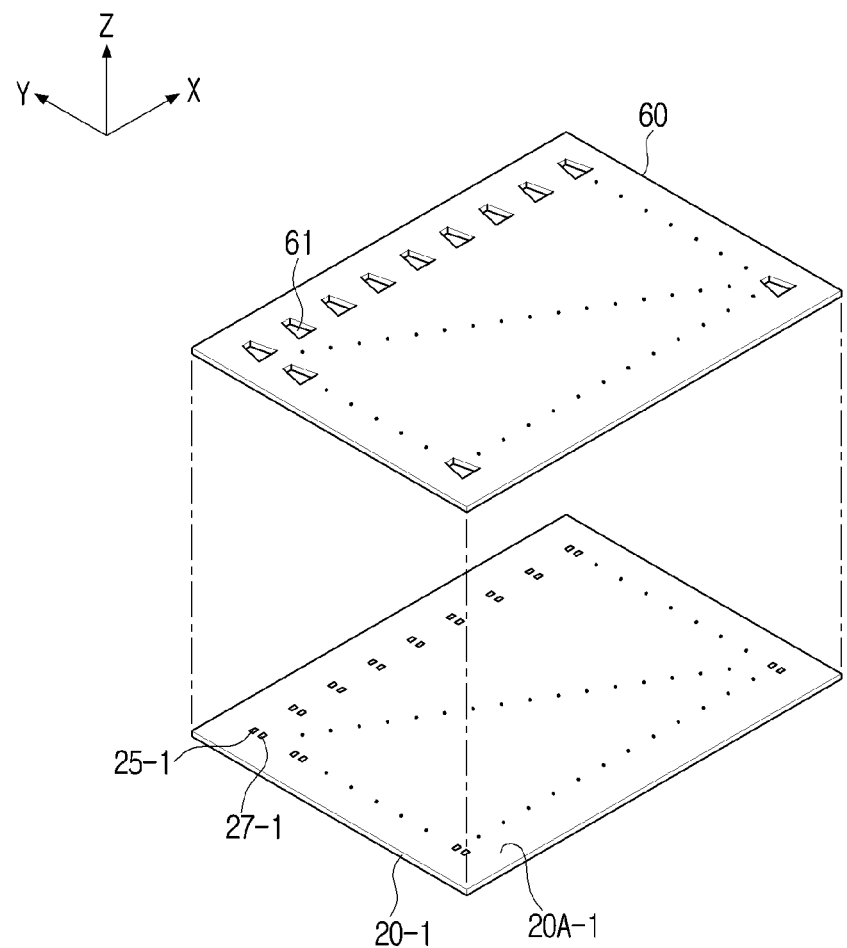
FIG. 7 is a perspective view illustrating a thin film guide member for guiding a plurality of inorganic light emitting diodes to a transfer position of a substrate according to another embodiment.

FIG. 7 is a perspective view illustrating a thin film guide member for guiding a plurality of inorganic light emitting diodes to a transfer position of a substrate according to another embodiment.

Regarding to FIG. 7, a guide member 60 includes a plurality of guide holes 61, and a substrate 20-1 includes a plurality of pairs of connection pads (e.g., a pair of a first connection pad 25-1 and a second connection pad 27-1). The guide member 60 may be coupled to a mounting surface 20A-1 of the substrate 20-1, for example, using an adhesive. Each hole 61 may be aligned with a pair of connection pads 25-1 and 27-1.

Figure 8:
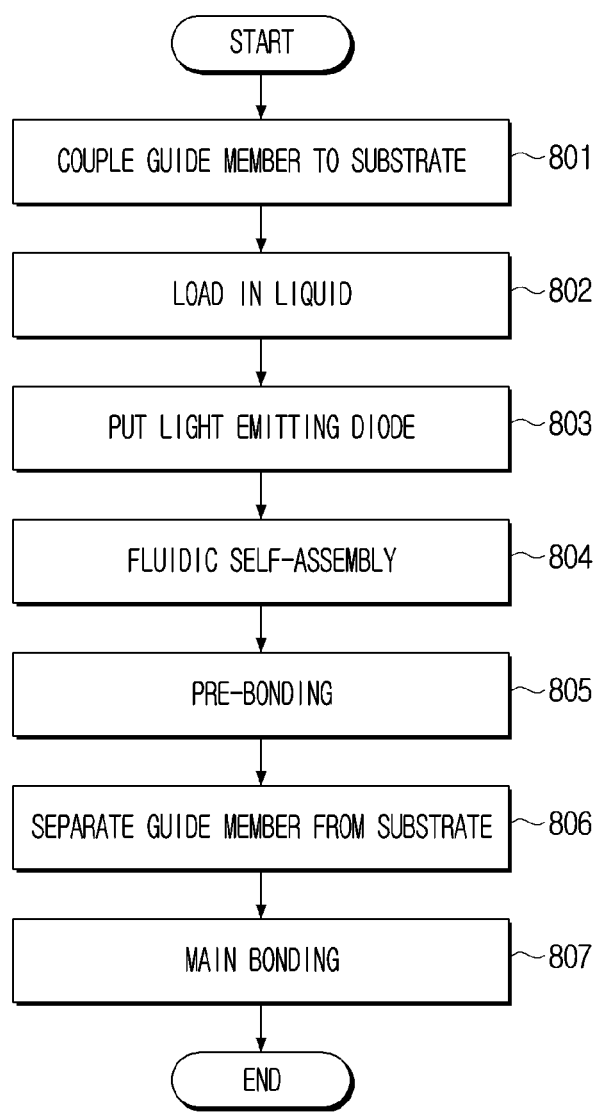
FIG. 8 is a flowchart illustrating a method of transferring a plurality of inorganic light emitting diodes to a substrate through a fluidic self-assembly method.
Figure 9:
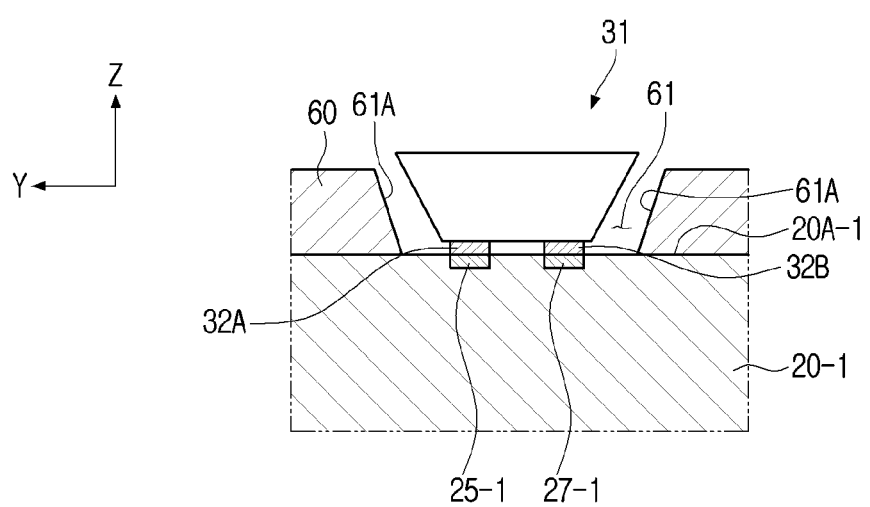
FIG. 9 is a cross-sectional view illustrating an example in which an inorganic light emitting diode is guided by a thin film guide member and transferred to a substrate.
Figure 10:
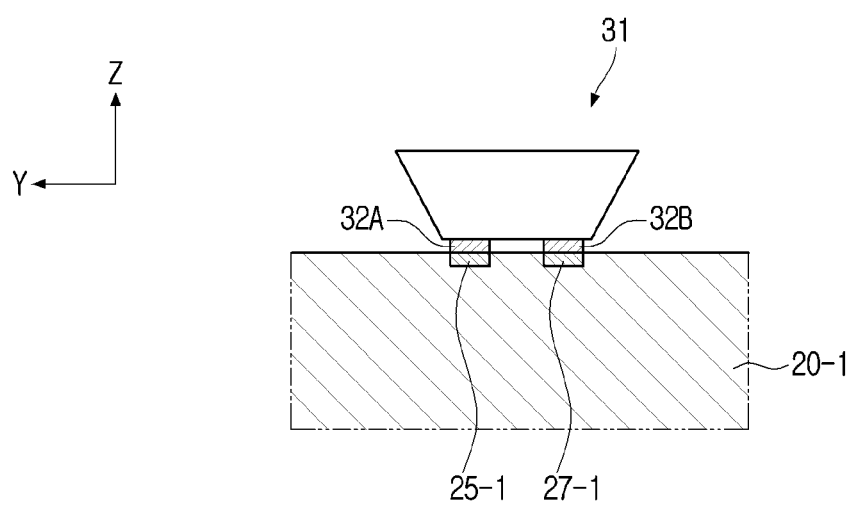
FIG. 10 is a view illustrating an example in which a thin film guide member is removed from a substrate.

FIG. 8 is a flowchart illustrating a method of transferring a plurality of inorganic light emitting diodes to a substrate through a fluidic self-assembly method, FIG. 9 is a cross-sectional view illustrating an example in which an inorganic light emitting diode is guided by a thin film guide member and transferred to a substrate, and FIG. 10 is a view illustrating an example in which a thin film guide member is removed from a substrate.

Referring to FIG. 8, a guide member 60 may be coupled to a mounting surface 20A-1 of the substrate 20-1 (operation 801).

Referring to FIG. 9, a pair of connection pads may be disposed on the mounting surface 20A-1 of the substrate 20-1 with respect to each pixel area 40 (refer to FIG. 3). For example, as shown in FIG. 9, the pair of connection pads may be a first connection pad 25-1 connected to the first electrode 32A of the inorganic light emitting diode 31, and a second connection pad 27-1 connected to the second electrode 32B of the inorganic light emitting diode 31.

Mounting grooves for guiding a mounting position of the inorganic light emitting diode may not be formed on the mounting surface 20A-1 of the substrate 20-1, and a plane surface may be approximately formed.

In the guide member 60, a plurality of guide holes 61 corresponding to each pixel area of the substrate 20-1 may be formed. The guide member 60 may be coupled to the mounting surface 20A-1 of the substrate 20-1 such that the plurality of guide holes 61 are aligned with each pixel area of the substrate 20-1.

The plurality of guide holes 61 may have substantially the same shape as the trapezoidal shape of the light emitting surface of the inorganic light emitting diode 31. In particular, a size of the plurality of guide holes 61 may be slightly larger than the size of the inorganic light emitting diode 31 such that the inorganic light emitting diode 31 can be easily inserted.

Referring to FIG. 9, a narrow portion of each guide hole 61 may be disposed toward the first connection pad 25-1, and a wide portion of each guide hole 61 may be disposed toward the second connection pad 27-1. An arrangement direction of each guide hole 61 as described above may guide the mounting direction of the inorganic light emitting diode 31, such that the first electrode 32A of the inorganic light emitting diode 31 is connected a first connection pad 25-1 and a second electrode 32B of the inorganic light emitting diode 31 may be connected to the second connection pad 27-1 of the substrate 20-1.

Referring to FIG. 9, an inner wall 61A of each guide hole 61 may be formed to be inclined, respectively. Due to the inclined inner wall 61A, the upper opening of the guide hole 61 (e.g., entrance into which the inorganic light emitting diode is inserted) may be formed wider than a lower opening.

An adhesive for adhering the guide member 60 to the mounting surface 20A-1 of the substrate 20-1 may be applied on the mounting surface 20A-1 of the substrate 20-1, such that the guide member 60 is not separated from the substrate 20-1 during a transfer process.

Meanwhile, before bonding the substrate 20-1 and the guide member 60, a hydrophilic surface treatment may be performed on the substrate 20-1 and inorganic light emitting diode 31, respectively. For example, the hydrophilic surface treatment may be performed on first connection pads 25-1 or second connection pads 27-1 of the substrate 20-1. In addition, the hydrophilic surface treatment may be performed on the first electrode 32A or the second electrode 32B of each inorganic light emitting diode 31. For example, when hydrophilic treatment is performed on the first connection pads 25-1 of the substrate 20-1, hydrophilic treatment may be performed on the first electrode 32A of the inorganic light emitting diode 31. For example, a chemical treatment method, an ultraviolet irradiation method, an oxygen plasma treatment method, or the like may be applied to the hydrophilic surface treatment for modifying the substrate 20-1 and each inorganic light emitting diode 31 to be hydrophilic.

Referring to FIG. 8, after loading (operation 802) the substrate 20-1 coupled to the guide member 60 in a tank containing liquid for fluidic self-assembly, the plurality of inorganic light emitting diodes 31 may be put into the tank containing the liquid (operation 803).

Thereafter, when liquid 181 in the tank is forcibly circulated, the plurality of inorganic light emitting diodes 31 dispersed in the liquid may flow in the tank, and may be inserted into each guide hole 61 of the guide member 60 as shown in FIG. 9. For the forced circulation of the liquid in the tank, for example, a method of dispersing compressed air into the liquid in the tank may be applied, but the embodiment is not limited thereto.

Meanwhile, each inorganic light emitting diode 31 may be provided with a post protruding to a predetermined height on the light emitting surface 31A. In the case of fluidic self-assembly, the post may prevent the inorganic light emitting diode 31 from being inserted upside down into the guide hole 61 (e.g., the light emitting surface 31A of the inorganic light emitting diode 31 is inserted into the guide hole 61 in a state of facing the mounting surface 20A-1).

Referring to FIG. 8, each inorganic light emitting diode 31 may be arranged at each position of the substrate 20-1 while being inserted into the guide hole 61 of the guide member 60 (operation 804).

After the plurality of inorganic light emitting diodes 31 are arranged on the substrate 20-1, the plurality of inorganic light emitting diodes 31 may be taken out from the tank.

Referring to FIG. 8, pre-bonding may be performed before the guide member 60 is separated from the substrate 20-1 (operation 805).

For example, in the pre-bonding, the plurality of inorganic light emitting diodes 31 may be thermally compressed toward the substrate 20-1 using a pressing member and bond the plurality of inorganic light emitting diodes 31 to the mounting surface 20A-1 of the substrate 20-1. In particular, the first and second electrodes 32A and 32B of the plurality of inorganic light emitting diodes 31 may be bonded to the first and second connection pads 25-1 and 27-1 arranged on the mounting surface 20A-1 of the substrate 20-1 corresponding to the first and second electrodes 32A and 32B. The bonding between the first electrode 32A and the corresponding first connection pad 25-1 and between the second electrode 32B and the corresponding second connection pad 27-1 may refer to bonding force that when the guide member 60 is separated from the substrate 20-1, the inorganic light emitting diode 31 transferred to the substrate 20-1 is not separated from the substrate 20-2 together with the guide member 60.

The guide member 60 may be made of a synthetic resin or metal material having heat resistance such that deformation does not occur during a thermocompression process.

Meanwhile when the post described above is provided on the light emitting surface 31A of each inorganic light emitting diode 31, it may be removed before the guide member 60 is separated from the substrate 20-1. According to another example, the post may not be continuously removed from the light emitting surface 31A of the inorganic light emitting diode 31 even after the guide member 60 is separated from the substrate 20-1.

Referring to FIGS. 8 and 10, the guide member 60 may be separated from the substrate 20-1 (operation 806).

For example, the guide member 60 attached to the substrate 20-1 may be removed by a chemical method. In particular, the guide member 60 may be formed of a material that can be dissolved by a solvent that does not dissolve various components formed on the substrate 20-1. For example, when the guide member 60 is made of resin, the solvent may have a component capable of dissolving the resin.

Referring to FIG. 8, the plurality of inorganic light emitting diodes 31 may be firmly bonded to the mounting surface 20A-1 of the substrate 20-1 through main bonding (operation 807).

The main bonding may be performed through a thermocompression process like pre-bonding. In particular, the first and second electrodes 32A and 32B of the inorganic light emitting diode 31 may be, for example, eutectic bonded to the first and second connection pads 25-1 and 27-1 arranged on the mounting surface 20A-1 of the surface 20-1 corresponding to the first and second electrodes 32A and 32B. Here, the eutectic bonding may refer to a process of joining two substrates together using an eutectic liquid that is formed when two or more diffusion materials are alloyed or heated. The eutectic liquid may have a lower melting point than the individual diffusion materials, and the state of the diffusion materials may change from a solid state to a liquid state without going through an intermediate state between the solid state and the liquid state, when the constituent metals of the alloy constituting each of the electrodes 32A and 32B and each of the connection pads 25-1 and 27-1 have a certain ratio.

As described above, when the fluidic self-assembly method is performed by coupling the guide member 60 to the substrate 20-1, the substrate 20-1 may not need to have a separate mounting groove on the mounting surface 20A-1. Accordingly, a separate process for forming the mounting groove on the substrate 20-1 may be omitted, thereby reducing manufacturing cost, and fundamentally preventing the substrate 20-1 from being damaged in the process of forming the mounting groove. In addition, since large-area transfer is possible using a general-purpose board having no mounting groove and having a substantially plane mounting surface, it may improve a manufacturing efficiency of the display module.

Figure 11:
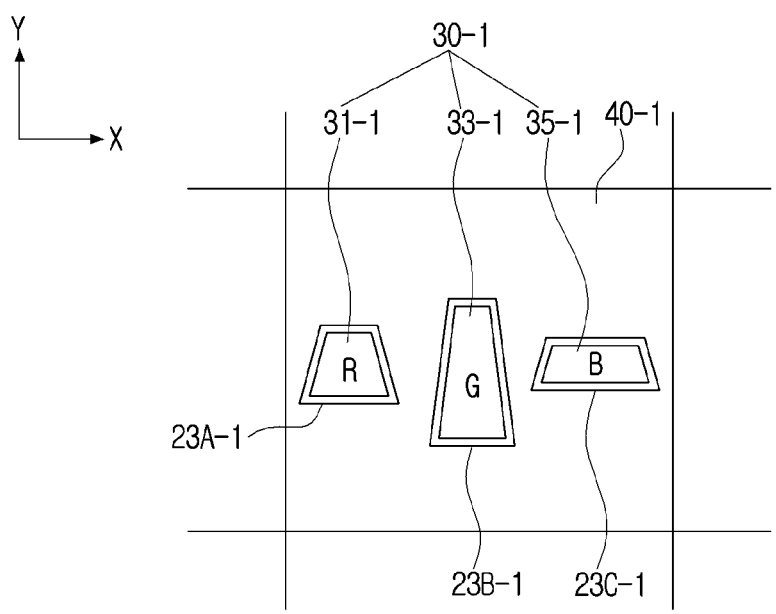
FIG. 11 is a plan view illustrating an example in which inorganic light emitting diodes having different shapes are arranged in each receiving groove having a shape corresponding to a shape of a substrate.

FIG. 11 is a plan view illustrating an example in which inorganic light emitting diodes having different shapes are arranged in each receiving groove having a shape corresponding to a shape of a substrate.

According to various embodiments of the disclosure, although all of a first subpixel 31-1, a second subpixel 33-1, and a third subpixel 35-1 constituting one pixel 30-1 are formed in a trapezoidal shape, each of the subpixels 31-1, 33-1, and 35-1 may not need to have the same shape and the same size of the light emitting surfaces.

For example, as shown in FIG. 11, a Y-direction length of the second subpixel 33-1 may be longer than a length of the first subpixel 1-1, and a width in the X-direction of the third subpixel 35-1 may be wider than a width of the first subpixel 31-1.

In particular, the first mounting groove 23A-1, the second mounting groove 23B-1, and the third mounting groove 23C-1 inserted into which the first subpixel 31-1, the second subpixel 33-1, and the third subpixel 35-1 may have be formed substantially the same as the corresponding subpixels 31-1, 33-1, and 35-1, respectively, and may be formed to be slightly larger than sizes of the corresponding subpixels 31-1, 33-1, and 35-1.

Accordingly, when the first to third subpixels 31-1, 33-1, and 35-1 are mounted on the substrate in a fluidic self-assembly method, they may be put into a tank containing liquid at once and may be arranged in each mounting groove 23A-1, 23B-1, and 23C-1 of the substrate. Accordingly, since there is no need to sequentially put the subpixels into the tank for each emission color, a manufacturing time required for the fluidic self-assembly may be shortened.

Although the inorganic light emitting diodes 31, 33, 35, 31-1, 33-1 and 35-1 described above are described as having the light emitting surface 31A is left and right symmetric trapezoid, but is not limited thereto. Hereinafter, an inorganic light emitting diode having a trapezoidal shape in which the light emitting surface is left and right asymmetric will be described with reference to the drawings.

Figure 12:
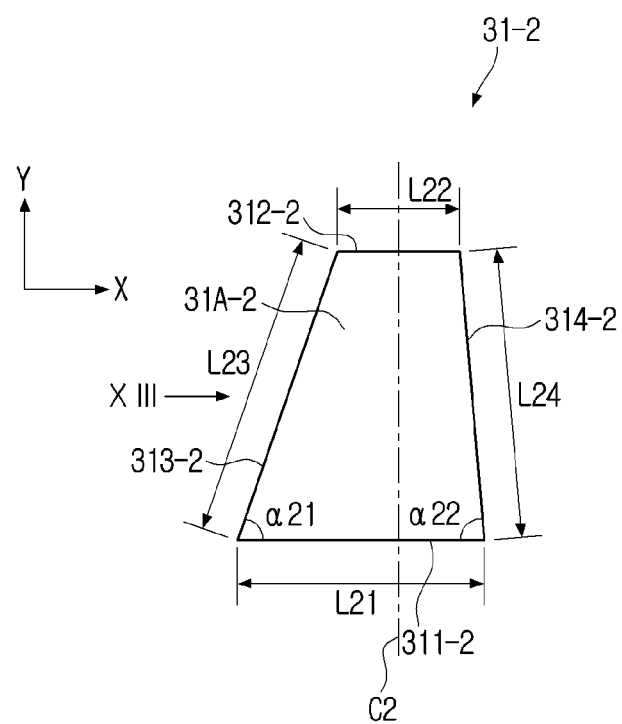
FIG. 12 is a plan view illustrating an inorganic light emitting diode according to another embodiment.
Figure 13:
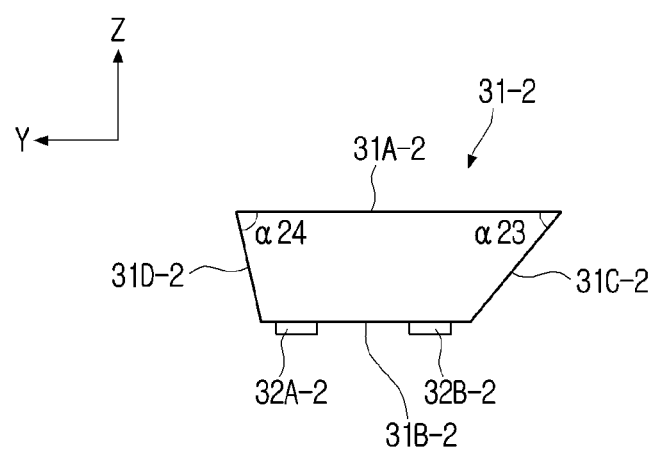
FIG. 13 is a side view of an inorganic light emitting diode viewed from a direction XIII shown in FIG. 12.
Figure 14:
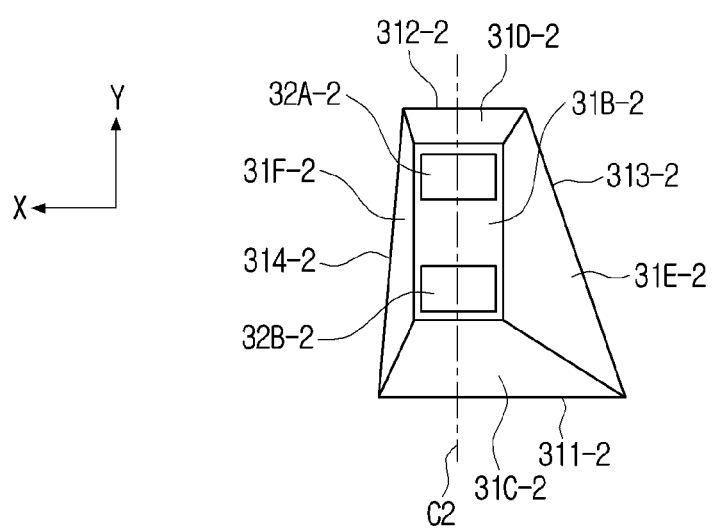
FIG. 14 is a bottom view illustrating an inorganic light emitting diode according to another embodiment.

FIG. 12 is a plan view illustrating an inorganic light emitting diode according to another embodiment, FIG. 13 is a side view of an inorganic light emitting diode viewed from a direction XIII shown in FIG. 12, and FIG. 14 is a bottom view illustrating an inorganic light emitting diode according to another embodiment.

Referring to FIG. 12, a light emitting surface 31A-2 of an inorganic light emitting diode 31-2 may be substantially plane, and its shape may be defined by a first side 311-2, a second side 312-2, a third side 313-2, and a fourth side 314-2.

For example, the first side 311-2 and the second side 312-2 facing each other may be disposed substantially parallel to each other with an interval therebetween. The first side 311-2 and the second side 312-2 may be arranged substantially perpendicular to the second center line C2, respectively. In particular, a first length L21 of the first side 311-2 may be shorter than a second length L22 of the second side 312-2.

A third side 313-2 may connect one end of the first side 311-2 and one end of the second side 312-2, and may be inclined by a first angle $\alpha21$ from the first side 311-2. Here, the first angle $\alpha21$ may be an acute angle. A third length L23 of the third side 313-2 is illustrated to be longer than the second length L22, but it is not limited thereto. For example, the third length L23 may be shorter than or equal to the first length L21. For example, the third length L23 may be shorter than or equal to the second length L22.

A fourth side 314-2 may connect the other end of the first side 311-2 and the other end of the second side 312-2, and may be inclined by a second angle $\alpha22$ from the first side 311-2. In particular, the first angle $\alpha21$ and the second angle $\alpha22$ may be different from each other. For example, as shown in FIG. 12, the first angle $\alpha21$ may be greater than the second angle $\alpha22$. Alternatively, the first angle $\alpha21$ may be smaller than the second angle $\alpha22$.

The length L24 of the fourth side 314-2 may be different from the length L23 of the third side 313-3. For example, as shown in FIG. 12, the length L24 of the fourth side 314-2 may be greater than the length L23 of the third side 313-3. Alternatively, the length L24 of the fourth side 314-2 may be smaller than the length L23 of the third side 313-3.

As such, the shape of the inorganic light emitting diode 31-2 may be defined by the first to fourth sides L1, L2, L3, and L4. Referring to FIG. 12, the light emitting surface 31A-2 viewed from the upper side of the inorganic light emitting diode 31-2 may have a substantially trapezoidal shape. For example, the light emitting surface 31A-2 of the inorganic light emitting diode 31-2 may be trapezoid that is substantially left and right asymmetric with respect to a center line C2 orthogonal to the first and second sides 311-2 and 312-2 of the inorganic light emitting diode 31-2. In particular, the second center line C2 may pass through a center of the second side 312-2.

In FIG. 12, both the first angle $\alpha21$ and the second angle $\alpha22$ are illustrated as acute angles, but is not limited thereto. For example, any one of the first angle $\alpha21$ and the second angle $\alpha22$ may be an acute angle, and the other may be a right angle or an obtuse angle.

Referring to FIG. 14, the inorganic light emitting diode 31 may include a first side surface 31C-2, a second side surface 31D-2, a third side surface 31E-2, and a fourth side surface 31F-2 between the light emitting surface 31A-2 (refer to FIG. 12) and the bottom surface 31B-2.

When a size of the bottom surface 31B-2 of the inorganic light emitting diode 31-2 is smaller than a size of the light emitting surface 31A-2, the first to fourth side surfaces 31C-2, 31D-2, 31E-2, and 31F-2 may be arranged to be inclined.

For example, referring to FIG. 13, the first and second side surfaces 31C-2 and 31D-2 may be disposed to be inclined from an upper side to a lower side of the inorganic light emitting diode 31-2. In particular, an inner wall of a mounting groove into which the inorganic light emitting diode 31-2 is inserted may be inclined in a direction substantially similar to the inclination direction of the first and second side surfaces 31C-2 and 31D-2, respectively. The first side surface 31C-2 may be inclined at a third angle $\alpha23$ with respect to the light emitting surface 31A-2, and the second side surface 31D-2 may be included at a fourth angle $\alpha24$ with respect to the light emitting surface 31A-2. In particular, both the third angle $\alpha23$ and the fourth angle $\alpha24$ may be acute angles, and may be different angles. Accordingly, the side of the inorganic light emitting diode 31-2 may be an inverted trapezoidal shape that is left and right asymmetric.

Referring to FIG. 14, the bottom surface 31B-2 of the inorganic light emitting diode 31-2 has a substantially rectangular shape, but is not limited thereto. For example, the bottom surface 31B-2 of the inorganic light emitting diode 31-2 may have various shapes, such as a square shape, a trapezoidal shape, or the like.

Figure 15:
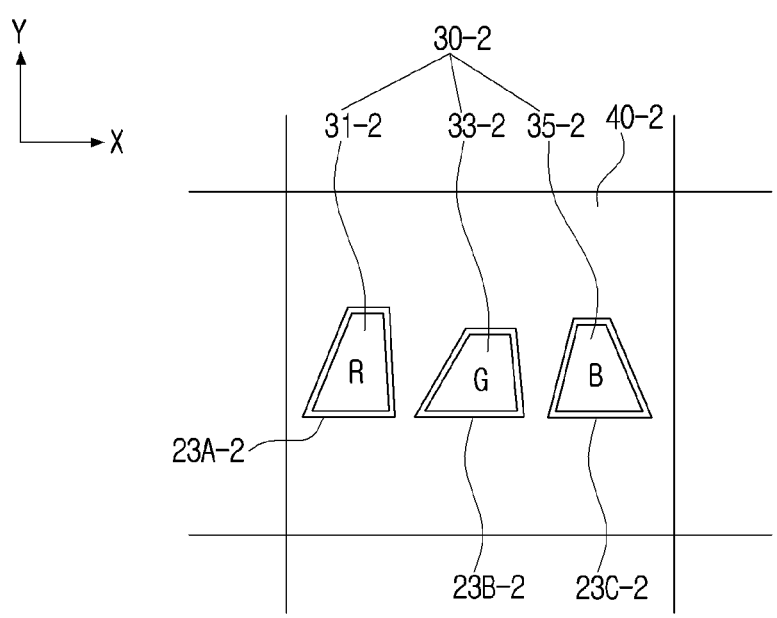
FIG. 15 is a view illustrating inorganic light emitting diodes according to another embodiment, and is a plan view illustrating an example in which inorganic light emitting diodes having different shapes are arranged in each receiving groove having a shape corresponding to a substrate.

FIG. 15 is a view illustrating inorganic light emitting diodes according to another embodiment, and is a plan view illustrating an example in which inorganic light emitting diodes having different shapes are arranged in each receiving groove having a shape corresponding to a substrate; and According to various embodiments of the disclosure, although all of a first subpixel 31-2, a second subpixel 33-2, and a third subpixel 35-2 constituting one pixel 30-2 are formed in a trapezoidal shape, each of the subpixels 31-2, 33-2, and 35-2 may not need to have the same shape and the same size of the light emitting surfaces.

For example, as shown in FIG. 15, a Y-direction length of the second subpixel 33-2 may be shorter than a length of the first subpixel 31-2, and a Y-direction length of the third subpixel 35-2 may be shorter than the length of the first subpixel 31-2 and longer than the length of the second subpixel 33-2. Alternatively, the first to third subpixels 31-2, 33-2 and 35-2 may have different sizes.

In particular, the first mounting groove 23A-2, the second mounting groove 23B-2, and the third mounting groove 23C-2 inserted into which the first subpixel 31-2, the second subpixel 33-2, and the third subpixel 35-2 may have be formed substantially the same as the corresponding subpixels 31-2, 33-2, and 35-2, respectively, and may be formed to be slightly larger than sizes of the corresponding subpixels 31-2, 33-2, and 35-2.

Accordingly, when the first to third subpixels 31-2, 33-2, and 35-2 are mounted on the substrate in a fluidic self-assembly method, they may be put into a tank containing liquid at once and may be arranged in each mounting groove 23A-2, 23B-2, and 23C-2 of the substrate. Accordingly, since there is no need to sequentially put the subpixels into the tank for each emission color, a manufacturing time required for the fluidic self-assembly may be shortened.

Figure 16:
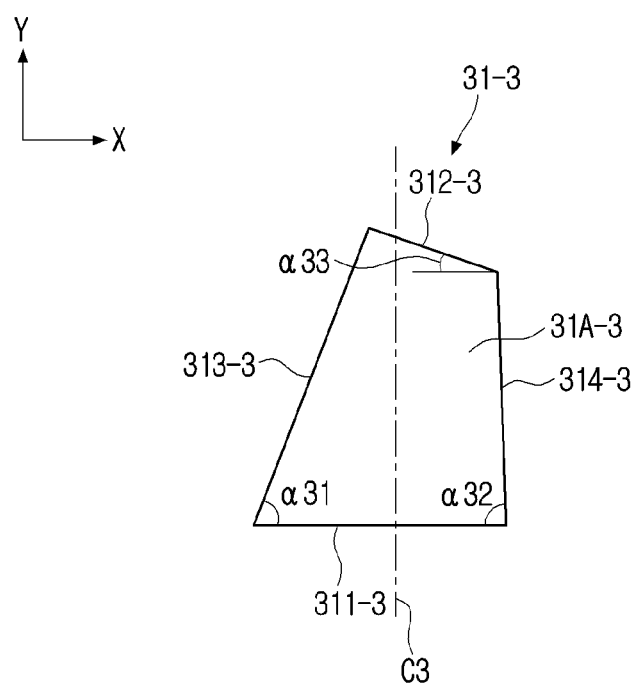
FIG. 16 is a plan view illustrating an inorganic light emitting diode according to another embodiment.

FIG. 16 is a plan view illustrating an inorganic light emitting diode according to another embodiment.

Referring to FIG. 16, a shape of the light emitting surface 31A-3 of the inorganic light emitting diode 31-3 may be defined by a first side 311-3, a second side 312-3, a third side 313-3, and a fourth side 314-3.

The first side 311-3 and the second side 312-3 facing each other of the inorganic light emitting diode 31-3 may be spaced apart and disposed at different angles. For example, the first side 311-3 and the second side 312-3 may be arranged not to be parallel. In particular, the first side 311-3 and the second side 312-3 may each intersect a third center line C3.

A third side 313-3 may connect one end of the first side 311-3 and one end of the second side 312-3, and may be inclined by a first angle α31 from the first side 311-3. Here, the first angle α31 may be an acute angle.

A fourth side 314-3 may connect the other end of the first side 311-3 and the other end of the second side 312-3, and may be inclined by a second angle α32 from the first side 311-3. In particular, the first angle α31 and the second angle α32 may be different from each other. For example, as shown in FIG. 15, the first angle α31 may be smaller than the second angle α32. Alternatively, the first angle α31 may be greater than the second angle α32. Also, the second side 312-3 may be disposed at a line parallel to the first side 311-3 and the third angle α33. In particular, the third angle α33 may be an acute angle.

The first to fourth sides 311-3, 312-3, 313-3, and 314-3 may all have different lengths. Alternatively, two of the first to fourth sides 311-3, 312-3, 313-3, and 314-3 may have substantially the same length.

As such, the shape of the inorganic light emitting diode 31-3 may be defined by the first to fourth sides 311-3, 312-3, 313-3, and 314-3. The light emitting surface 31A-3 viewed from the upper side of the inorganic light emitting diode 31-3 may be a quadrilateral that is left and right asymmetric and asymmetric top and bottom as shown in FIG. 16.

Although various embodiments of the disclosure have been individually described, but each embodiment is not necessarily implemented alone, and the configuration and operation of each embodiment may be implemented in combination with at least one other embodiments.

The foregoing exemplary embodiments are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. An inorganic light emitting diode comprising:
a first semiconductor layer;
a second semiconductor layer having a light emitting surface;
an active layer disposed between the first semiconductor layer and the second semiconductor layer;
a first electrode coupled to the first semiconductor layer; and
a second electrode coupled to the second semiconductor layer;
wherein the light emitting surface has a trapezoid shape, and two opposing sides of the light emitting surface are symmetric with respect to each other,
wherein a bottom surface of the inorganic light emitting diode is disposed to oppose the light emitting surface, and the first electrode and the second electrode are disposed on the bottom surface of the inorganic light emitting diode, and
wherein a size of the light emitting surface is larger than a size of the bottom surface of the inorganic light emitting diode,
a first side surface and a second side surface which face each other, a third side surface and a fourth side surface which face each other, are included between the light emitting surface and the bottom surface of the inorganic light emitting diode,
wherein the first side, the second side, the third side, and the fourth side are disposed to have an acute angle with respect to the light emitting surface.

2. The inorganic light emitting diode of claim 1, wherein the light emitting surface comprises:
a first side and a second side that are disposed parallel to each other;
a third side that connects one end of the first side and one end of the second side; and
a fourth side that connects another end of the first side and another end of the second side and is symmetric with respect to the third side.

3. The inorganic light emitting diode of claim 2, wherein the first side and the second side have different lengths from each other.

4. The inorganic light emitting diode of claim 2, wherein the third side is disposed at a first angle with respect to the first side, 
wherein the fourth side is disposed at a second angle with respect to the first side, and 
wherein the first angle and the second angle are a same acute angle.

5. The inorganic light emitting diode of claim 1, wherein the inorganic light emitting diode has an inverted trapezoidal shape when viewed from a side of the inorganic light emitting diode.

6. The inorganic light emitting diode of claim 1, wherein the inorganic light emitting diode is left and right symmetric when viewed from the side of the inorganic light emitting diode.

7. A display comprising:
a plurality of inorganic light emitting diodes comprising a trapezoidal light emitting surface, and a first electrode and a second electrode are disposed on an opposite surface of the light emitting surface; and
a substrate comprising a plurality of mounting grooves on which the plurality of inorganic light emitting diodes are mounted,
wherein the light emitting surface of the inorganic light emitting diode has a trapezoid shape that is left and right symmetric,
wherein each of the plurality of mounting grooves has a shape corresponding to the light emitting surface of the plurality of inorganic light emitting diodes, and has a size larger than a size of each of the plurality of inorganic light emitting diodes.

8. The display of claim 7, wherein the inorganic light emitting diode has an inverted trapezoidal shape when viewed from a side of the inorganic light emitting diode.

9. A method of manufacturing a display for mounting a plurality of inorganic light emitting diodes on a substrate, the method comprising:
coupling a guide member provided with a plurality of guide holes to a mounting surface of the substrate;
after the guide member is coupled to the substrate, loading the substrate into a container containing liquid;
introducing the plurality of inorganic light emitting diodes having a trapezoidal light emitting surface into the liquid;
aligning the plurality of inorganic light emitting diodes on the substrate through the plurality of guide holes;
bonding the plurality of inorganic light emitting diodes to the substrate; and
separating the substrate from the guide member,
wherein the coupling the guide member to the mounting surface of the substrate comprises:
applying an adhesive to the mounting surface of the substrate, and aligning the plurality of guide holes to correspond to each pixel area on the mounting surface of the substrate.

10. The method of claim 9 further comprising:
chemically removing the guide member from the mounting surface of the substrate, using a solvent capable of dissolving the guide member.

11. A display panel comprising a plurality of pixels, wherein:
each of the plurality of pixels comprises a plurality of subpixels and at least one thin film transistor;
each of the plurality of subpixels comprises an inorganic light emitting diode; and
the inorganic light emitting diode comprises a light emitting surface having a trapezoid shape,
wherein the light emitting surface of the inorganic light emitting diode comprises:
a first side and a second side that are parallel to each other;
a third side that connects one end of the first side and one end of the second side; and
a fourth side that connects another end of the first side and another end of the second side and is symmetric with respect to the third side.

12. The display panel of claim 11, wherein the inorganic light emitting diode further comprises:
a first semiconductor layer;
a second semiconductor layer that comprises the light emitting surface; and
an active layer disposed between the first semiconductor layer and the second semiconductor layer.

13. The display panel of claim 12, wherein the inorganic light emitting diode further comprises:
a first electrode coupled to the first semiconductor layer; and
a second electrode coupled to the second semiconductor layer.

14. The method of claim 11 wherein the first side and the second side have different lengths from each other.

* * * * *